(12) United States Patent
Czopek et al.

(10) Patent No.: US 12,383,978 B2
(45) Date of Patent: Aug. 12, 2025

(54) OPTOMECHANICAL ASSEMBLIES FOR TEMPERATURE-ROBUST LASER BEAM COMBINATION AND DELIVERY

(71) Applicant: Coherent, Inc., Santa Clara, CA (US)

(72) Inventors: Bradley Czopek, Portland, OR (US); Cameron Simmons, Portland, OR (US)

(73) Assignee: Coherent, Inc., Santa Clara, CA (US)

( * ) Notice: Subject to any disclaimer, the term of this patent is extended or adjusted under 35 U.S.C. 154(b) by 877 days.

(21) Appl. No.: 17/580,325

(22) Filed: Jan. 20, 2022

(65) Prior Publication Data

US 2022/0241892 A1     Aug. 4, 2022

Related U.S. Application Data

(60) Provisional application No. 63/143,670, filed on Jan. 29, 2021.

(51) Int. Cl.
| | | |
|---|---|---|
| *B23K 26/064* | (2014.01) | |
| *B23K 26/06* | (2014.01) | |
| *G02B 7/02* | (2021.01) | |
| *H01S 3/00* | (2006.01) | |

(52) U.S. Cl.
CPC ........ *B23K 26/064* (2015.10); *B23K 26/0604* (2013.01); *B23K 26/0665* (2013.01); *G02B 7/028* (2013.01); *H01S 3/0071* (2013.01)

(58) Field of Classification Search
USPC ........................................................ 359/618
See application file for complete search history.

(56) References Cited

U.S. PATENT DOCUMENTS

| | | | | |
|---|---|---|---|---|
| 6,381,387 B1 * | 4/2002 | Wendland, Jr. | ..... | G02B 6/29398 385/47 |
| 6,603,611 B1 * | 8/2003 | Hookman | .............. | G02B 7/008 359/822 |
| 6,836,968 B1 * | 1/2005 | Walker | ................. | F16M 11/048 33/1 M |
| 12,270,703 B2 * | 4/2025 | Bendick | ................ | G01J 3/0229 |

(Continued)

OTHER PUBLICATIONS

International Search Report and Written Opinion for International Patent Application No. PCT/US2021/065673 mailed Apr. 25, 2022, 13 pages.

*Primary Examiner* — Wyatt A Stoffa
*Assistant Examiner* — Seth D Moser
(74) *Attorney, Agent, or Firm* — Morrison & Foerster LLP

(57) ABSTRACT

An optomechanical assembly for temperature-robust laser beam processing includes a baseplate and an optics plate. The baseplate includes a source area for accommodating a source of the laser beam, and a light-processing area located away from the source area and including first and second anchor points. The optics plate is disposed in the light-processing area and includes first and second portions and a flexible coupling interconnecting the first and second portions. The first and second portions are fixed to the baseplate at the first and second anchor points, respectively. The flexible coupling allows for a thermally-induced change in distance between the first and second anchor points in the presence of dissimilar thermal expansion of the optics plate and the baseplate. The assembly further includes a series of optical elements for manipulating a laser beam from the laser source. Each of the optical elements is rigidly bonded to the first portion.

22 Claims, 5 Drawing Sheets

(56) References Cited

U.S. PATENT DOCUMENTS

| | | | |
|---|---|---|---|
| 2005/0073757 A1* | 4/2005 | Turner | G02B 7/00 |
| | | | 359/871 |
| 2007/0002926 A1 | 1/2007 | McDonald et al. | |
| 2008/0251738 A1* | 10/2008 | Figueroa | H01S 3/1055 |
| | | | 372/5 |
| 2015/0077869 A1* | 3/2015 | Meng | G02B 27/0966 |
| | | | 359/837 |
| 2023/0136420 A1* | 5/2023 | Kao | G02B 27/0025 |
| | | | 359/618 |

* cited by examiner

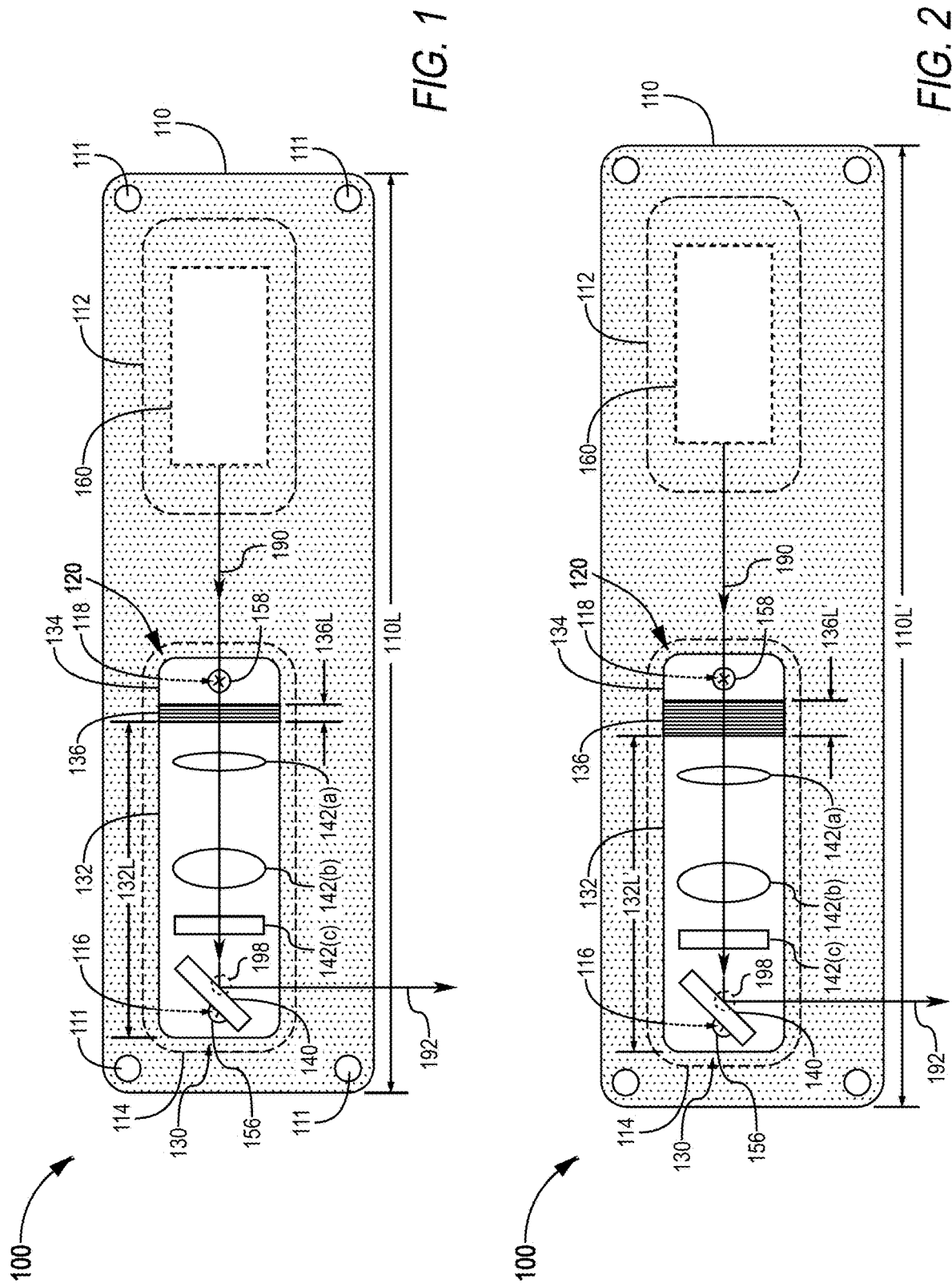

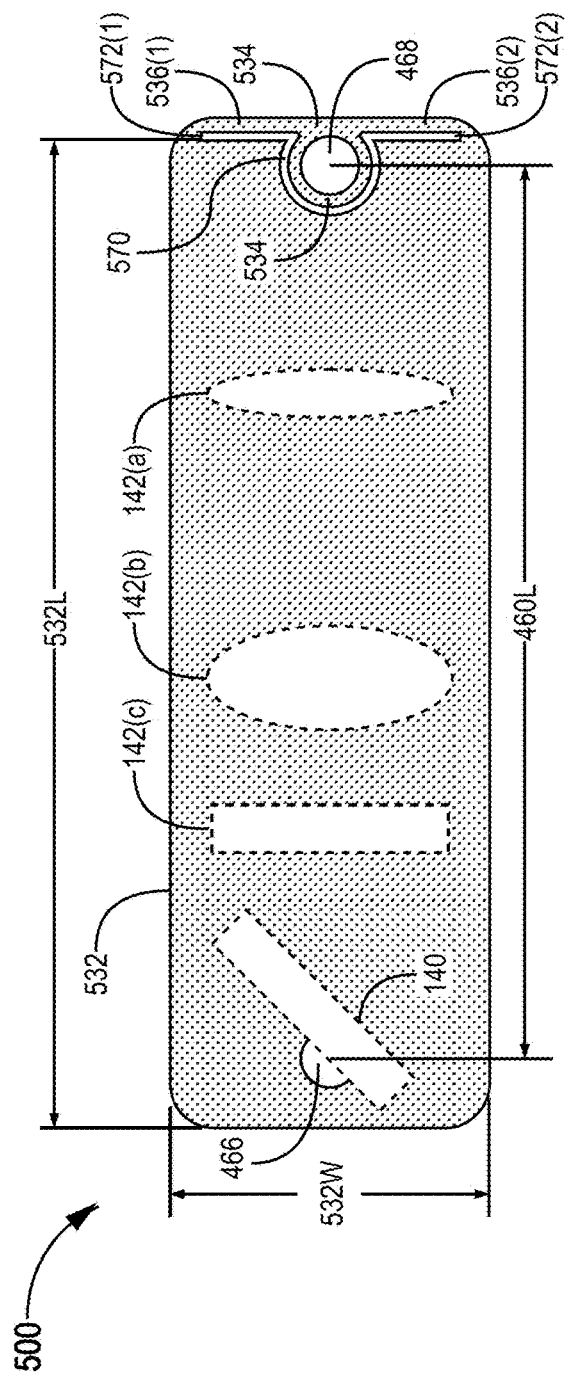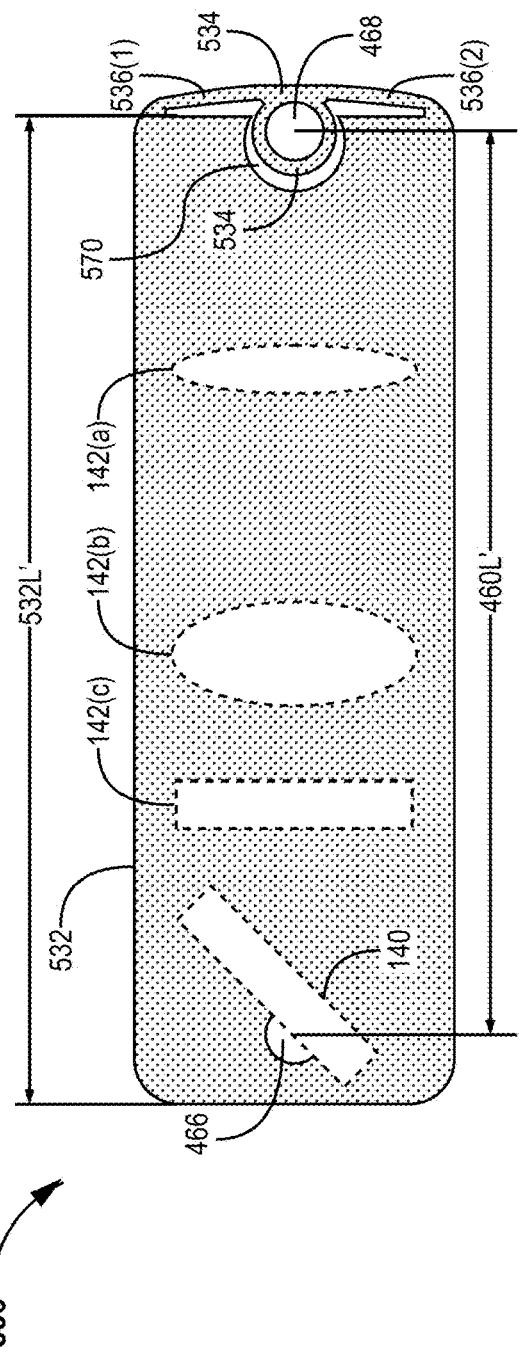

OPTOMECHANICAL ASSEMBLIES FOR TEMPERATURE-ROBUST LASER BEAM COMBINATION AND DELIVERY

PRIORITY

This application claims priority to U.S. Provisional Application Ser. No. 63/143,670, filed Jan. 29, 2021, the disclosure of which is incorporated herein in its entirety.

TECHNICAL FIELD OF THE INVENTION

The present invention relates in general to laser beam shaping and directing in the presence of temperature variation, in particular to optomechanical assemblies adapted to reduce temperature-induced changes in spatial properties of a laser beam.

DISCUSSION OF BACKGROUND ART

Laser light may be generated with a high degree of spatial coherence. The high spatial coherence offers a level of spatial control that cannot be achieved using incoherent light sources such as incandescent light bulbs or even light-emitting diodes. For example, a laser beam can be focused tightly or form a well-collimated laser beam that maintains a relatively small beam diameter over great distances. It is therefore possible to deliver a laser beam very precisely to a target location and, furthermore, deliver the laser beam to the target location with well-defined transverse size and convergence/divergence. This spatial control may, however, be affected by changes in the temperature of the environment. As the temperature of the environment changes, or as internal parts of a laser system generate heat, optical elements used to manipulate the laser beam may expand or contract, and their locations may shift due to thermal expansion or contraction of structures supporting the optical elements. These temperature effects can cause a variety of issues, such as laser beam pointing error, loss of collimation, and changes in convergence/divergence resulting in a longitudinal focus shift. Herein, the terms "transverse" and "longitudinal" are defined with respect to the local propagation direction of the referenced laser beam.

Many laser-based technologies rely on stable spatial properties of a laser beam. Such technologies may utilize a variety of schemes to stabilize the spatial laser beam properties in the presence of temperature changes. The temperature of the laser system, or one or more key subsystems thereof, may be actively controlled to maintain a constant temperature throughout a wide temperature range. The materials of optical elements and/or support structures may be limited to materials that have relatively low coefficients of thermal expansion. Another option is to actively control certain optical elements to correct for temperature-induced changes. For example, changes to laser beam pointing or a laser beam parameter (such as waist size, waist location, and Rayleigh range).

Modern, laser-based flow cytometry is one example of a technology that requires stable spatial properties of a laser beam. In flow cytometry, the laser beam is focused on a flowing sample. Typically, as fluorescently-labeled cells within the flowing sample pass through the laser beam focus one by one, fluorescence, forward-scattered laser light, and side-scattered laser light are independently detected to identify the cells by their fluorescence properties and size. The transverse profile of the laser beam at its focus may be narrow in the dimension parallel to the sample flow path and elongated in the transverse dimension perpendicular to the sample flow path, with the narrow dimension being as small as about 10-15 microns. Reliable and accurate cell identification relies on the laser beam focus being stable. Most commercially available flow cytometers are equipped with multiple lasers, each having a different wavelength, for compatibility with many different fluorophores and for processing of samples labeled with a combination of different fluorophores. Until recently, the different laser beams intersected the sample flow path at different locations, and each laser channel had its own separate side-scattered fluorescence detection system. More recently, however, so called spectral flow cytometers have been developed. A spectral flow cytometer co-propagates and co-focuses all laser beams to the same plane of intersection with the sample flow path. As compared to a conventional flow cytometry, spectral flow cytometry uses a single side-scatter fluorescence detection system common to all laser channels. This fluorescence detection system uses a spectrograph to distinguish between different wavelengths.

SUMMARY OF THE INVENTION

Disclosed herein are optomechanical assemblies for temperature-robust delivery of a laser beam. The present optomechanical assemblies are based on a two-prong approach to reducing the impact of temperature changes on a subassembly for manipulating the laser beam: (1) materials of the subassembly have relatively low coefficients of thermal expansion, and (2) mechanical decoupling between the subassembly and a supporting baseplate prevents thermal expansion or contraction of the baseplate from forcing expansion, contraction, or distortion of the subassembly. For the remainder of this disclosure, unless otherwise noted, the term expansion covers both positive expansion and negative expansion (i.e., contraction). The temperature of the optomechanical assemblies may change in response to ambient temperature changes or as heat is generated from an internal source such as a laser. Flow cytometers may utilize the presently disclosed assemblies for temperature-robust laser beam delivery to maintain a stable laser beam focus at the intersection with the sample flow path.

The same principles are applied to optomechanical assemblies for temperature-robust combination, and delivery, of a plurality of laser beams. In such beam-combining assemblies, multiple different subassemblies, made of materials with relatively low coefficients of thermal expansion are supported by a common baseplate. Each subassembly manipulates a different respective laser beam before this laser beam is combined with the other laser beams to form a composite laser beam. Mechanical decoupling between each subassembly and a supporting baseplate prevents thermal expansion of the baseplate from forcing expansion or distortion of the subassemblies. The presently disclosed beam-combination assemblies are suitable for incorporation in spectral flow cytometers, where they may maintain a stable focus of a composite multi-color laser beam at the intersection with the sample flow path.

In one aspect, an optomechanical assembly for temperature-robust laser beam processing includes a baseplate. The baseplate includes a source area for accommodating a source of the laser beam and a light-processing area located away from the source area and including first and second anchor points. The assembly further includes an optics plate disposed in the light-processing area. The optics plate includes first and second portions and a flexible coupling that interconnects the first and second portions. The first and second portions are fixed to the baseplate at the first and second anchor points, respectively. The flexible coupling allows for a thermally induced change in distance between the first and second anchor points in the presence of dissimilar thermal expansion of the optics plate and the baseplate. In addition, the assembly includes a linearly arranged series of optical elements for manipulating a laser beam from the laser source. Each of the optical elements is rigidly bonded to the first portion of the optics plate and arranged along a propagation axis of the laser beam that is coincident with a line between the first and second anchor points. The coefficient of thermal expansion (CTE) of the optics plate is (a) matched to the CTEs of the optical elements to within 20% and (b) lower than the CTE of the baseplate.

In another aspect, a temperature-robust optomechanical assembly for laser beam combination includes a baseplate that has orthogonal lengthwise and widthwise dimensions and includes a sequence of source areas. The source areas are distributed along the widthwise dimension and is each configured to accommodate a laser source for generating a respective laser beam. The assembly further includes a corresponding sequence of optical subassemblies offset from the sequence of source areas in the lengthwise dimension. Each optical subassembly includes an optics plate fixed to the baseplate. Each optics plate includes at least one flexure to accommodate dissimilar thermal expansion of the optics plate and the baseplate. At least one of the optical subassemblies includes a linearly arranged series of optical elements that is (a) rigidly bonded to the optics plate, (b) characterized by coefficients of thermal expansion (CTEs) that are matched with the CTE of the optics plate to within 20%, and (c) configured to manipulate the laser beam received from the corresponding source area. The assembly also includes a mirror rigidly bonded to the optics plate of a first one of the optical subassemblies. In addition, for each of the one or more subsequent optical subassemblies, the assembly includes a respective beam combiner rigidly bonded to the optics plate thereof. The mirror and the one or more beam combiners are cooperatively configured to serially combine the laser beams.

BRIEF DESCRIPTION OF THE DRAWINGS

The accompanying drawings, which are incorporated in and constitute a part of the specification, schematically illustrate preferred embodiments of the present invention, and together with the general description given above and the detailed description of the preferred embodiments given below, serve to explain principles of the present invention.

FIGS. 1 and 2 illustrate an optomechanical assembly for temperature-robust delivery of a laser beam, according to an embodiment.

FIGS. 5 and 6 illustrate another optics plate including two flexures that serve to decouple a series of optical elements from thermal expansion of a supporting baseplate, according to an embodiment.

DETAILED DESCRIPTION OF THE INVENTION

Figure 3:
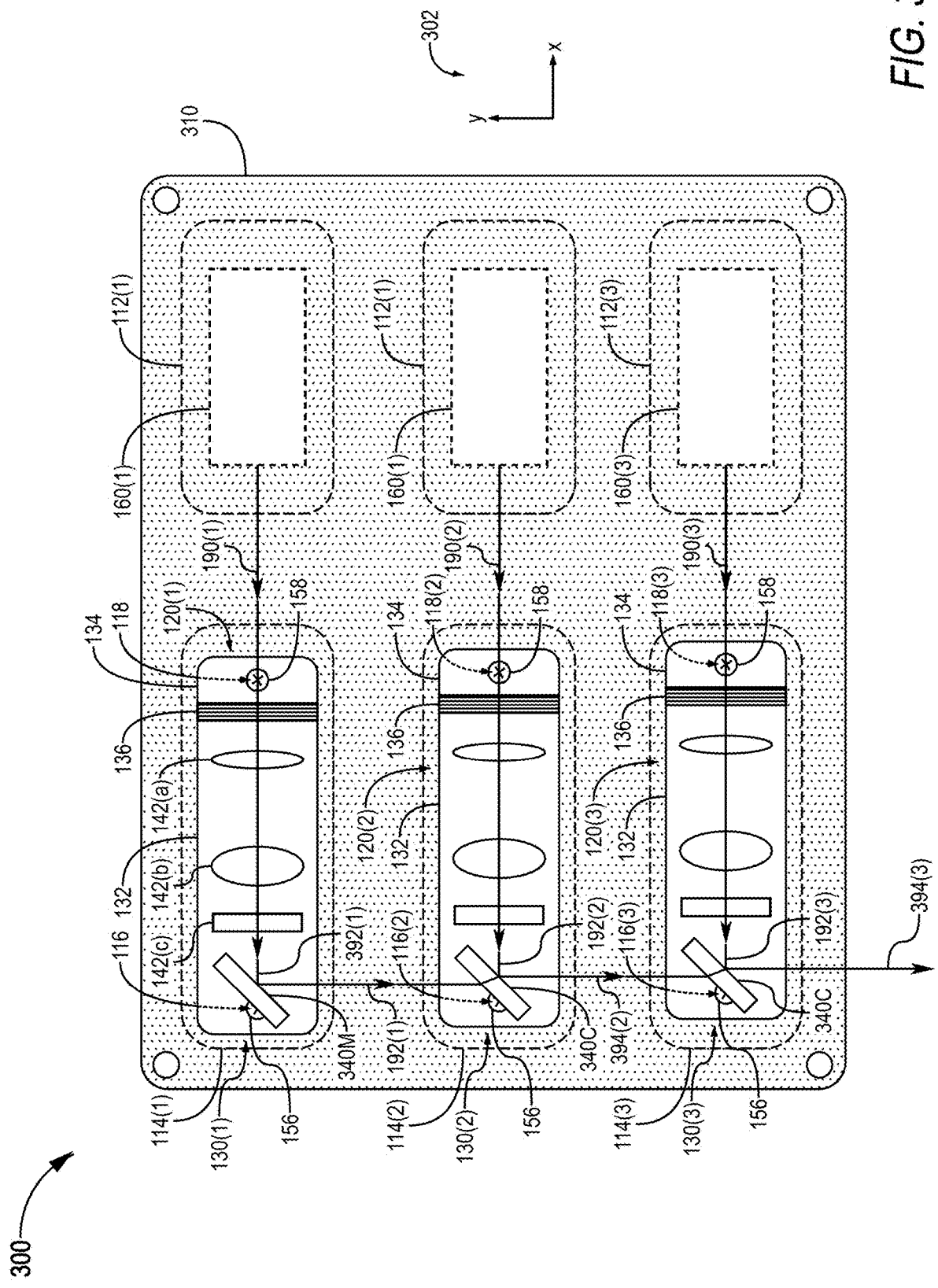
FIG. 3 illustrates an optomechanical assembly for temperature-robust laser beam combination, according to an embodiment.

Referring now to the drawings, wherein like components are designated by like numerals, FIGS. 1 and 2 are top plan views of one optomechanical assembly 100 for temperature-robust delivery of a laser beam. Assembly 100 may, advantageously, be implemented in a flow cytometer to deliver a laser beam to a sample flow path in a temperature robust manner. Assembly 100 includes a baseplate 110 and a subassembly 120 mounted on baseplate 110. Subassembly 120 is mounted to baseplate 110 in a light-processing area 114. Subassembly 120 is configured to manipulate a laser beam 190 received from a laser source 160 that is mounted to baseplate 110 in a source area 112. Assembly 100 may be provided with or without laser source 160. FIGS. 1 and 2 show the state of assembly 100 at two different temperatures. The temperature associated with FIG. 2 is higher than the temperature associated with FIG. 1.

The shape of baseplate 110 may be different from that shown in FIGS. 1 and 2, for example non-rectangular. Baseplate 110 may include a plurality of through-holes for mounting assembly 100 to a support. Four exemplary through-holes 111 are labeled in FIG. 1.

Subassembly 120 includes an optics plate 130 mounted to baseplate 110, and a series of optical elements 140 and 142 mounted to a portion 132 of optics plate 130. Optical elements 140 and 142 serve to manipulate laser beam 190 to produce a manipulated laser beam 192. Optical elements 140 and 142 are arranged in series along laser beam 190, and include a last optical element 140 as well as one or more preceding optical elements 142. In the example depicted in FIGS. 1 and 2, optical element 140 is a mirror and subassembly 120 includes three preceding optical elements 142 (a-c), wherein elements 142(a) and 142(b) are lenses and element 142(c) may be a waveplate, polarizer, or filter. In this depicted example, lenses 142(a) and 142(b) may form a telescope configured to change the size of a collimated laser beam. Without departing from the scope hereof, subassembly 120 may instead be implemented with a different series of optical elements than depicted in FIGS. 1 and 2.

Optical elements 140 and 142 are rigidly bonded to portion 132 of optics plate 130. Each one of optical elements 140 or 142 may be bonded to optics plate 130 either directly or indirectly via one or more mounting elements. When indirectly bonded to optics plate 130 via a mount, the optical element is rigidly bonded to the mount, the mount is rigidly bonded to optics plate 130, and the mount itself is rigid. The coefficient of thermal expansion (CTE) of optics plate 130 is matched to the CTEs of optical elements 140 and 142, to within 20%, to prevent significant differences between thermal expansion of optics plate 130 and thermal expansion of optical elements 140 and 142 and, for example, to prevent the bonds from breaking during thermal expansion. For the same reasons, the CTEs of any mounts used to bond optical elements 140 and 142 to optics plate 130 are also matched to the CTEs of optical elements 140 and 142 to within 20%. Such mounts may be made of the same material as optical elements 140 and 142.

Furthermore, the CTEs of optics plate 130 and optical elements 140 and 142 are relatively low in order to limit changes in the relative locations of optical elements 140 and 142 caused by thermal expansion of optics plate 130 and/or optical elements 140 and 142 themselves. In one example, the CTEs of optics plate 130 and each optical element 140 and 142 are less than $10^{-5}$ $K^{-1}$.

In one embodiment, optics plate 130 is made of metal, and optical elements 140 and 142 are made of glass. In this embodiment, any mounts used to bond one or more of optical elements 140 and 142 to optics plate 130 may be made of metal or glass as well. Optics plate 130 may be made of titanium or a titanium alloy, for example an alpha-beta titanium alloy (e.g., Ti-6Al-4V). Optical elements 140 and 142 may be made of borosilicate glass, such as Schott N-BK7.

In addition to portion 132, optics plate 130 includes a portion 134 and a flexible coupling 136 that interconnects portions 132 and 134. Portions 132 and 134 are fixed to baseplate 110 at respective anchor points 116 and 118 of baseplate 110. Anchor points 116 and 118 are farther from and closer to, respectively, source area 112. In one embodiment, portion 132 is fixed to anchor point 116 of baseplate 110 by a fastener 156 through a hole in portion 132, and portion 134 is fixed to anchor point 118 of baseplate 110 by a fastener 158 through a hole in portion 134. Flexible coupling may include or consist of one or more flexures, each interconnecting portions 132 and 134 while allowing for changes in distance between portions 132 and 134.

As illustrated by the differences between FIGS. 1 and 2, flexible coupling 136 allows for a thermally induced change in the distance between anchor points 116 and 118 in the presence of dissimilar thermal expansion of baseplate 110 and subassembly 120. Significantly dissimilar thermal expansion may arise when the CTEs of baseplate 110 and optics plate 130 differ by more than, e.g., 20%, for example when the CTE of baseplate 110 is at least twice the CTE of optics plate 130. At the lower temperature of FIG. 1, baseplate 110 has a length 110L, portion 132 has a length 132L, and portions 132 and 134 are a distance 136L apart. Length 110L, length 132L, and distance 136L are measured in the dimension parallel to the propagation axis of laser beam 190 between source area 112 and light-processing area 114. (Baseplate 110 may or may not have sides that are parallel to length 110L.) At the higher temperature of FIG. 2, baseplate 110 has a length 110L', portion 132 has a length 132L', and portions 132 and 134 are a distance 136L' apart. Since the CTE of optics plate 130 is less than the CTE of baseplate 110, the relative length increase of portion 132, i.e., (132L'-132L)/132L, is less than the relative length increase of baseplate 110, i.e., (110L'-110L)/110L. Anchor points 116 and 118 move with the thermal expansion of baseplate 110, and the difference in relative length increase between portion 132 and baseplate 110 is accommodated by flexible coupling 136. As seen in FIGS. 1 and 2, the distance 136L' between portions 132 and 134 at the higher temperature of FIG. 2 exceeds the distance 136L between portions 132 and 134 at the lower temperature of FIG. 1.

By virtue of flexible coupling 136, the relative positions of optical elements 140 and 142 are unaffected by the thermal expansion of baseplate 110, at least as long as the change in separation between anchor points 116 and 118 is within the dynamic range of flexible coupling 136. The relative positions of optical elements 140 and 142 may still be affected by their intrinsic thermal expansion as well as thermal expansion of portion 132. In the absence of flexible coupling 136, baseplate 110 and optics plate 130 would, by virtue of being fixed to each other at anchor points 116 and 118, act essentially as bimetallic strips. Therefore, without flexible coupling 136, dissimilar thermal expansion of baseplate 110 and optics plate 130 would cause deformation that changes the relative locations of optical elements 140 and 142, resulting in distortion and/or misalignment of laser beam 190.

In one embodiment, the CTEs of optics plate 130 and optical elements 140 and 142 are lower than the CTE of baseplate 110. For example, baseplate 110 may be made of aluminum or an aluminum alloy (e.g., 6061-T6), and optics plate 130 may be made of titanium or a titanium alloy, as discussed above. In this embodiment, the thermal expansions of optics plate 130 and baseplate 110 are dissimilar, but flexible coupling 136 accommodates the dissimilar thermal expansion and renders the relative locations of optical elements 140 and 142 robust to thermal expansion of baseplate 110. Assembly 100 thereby reduces thermal expansion effects on the relative locations of optical elements 140 and 142, as compared to an assembly where optical elements 140 and 142 are mounted directly to baseplate 110. The dynamic range of flexible coupling 136 may allow for a change in separation between anchor points 116 and 118 of up to at least several microns, for example up to at least 5 microns.

Without departing from the scope hereof, the CTE of baseplate 110 may be similar to or less than the CTEs of optics plate 130 and optical elements 140 and 142.

In the embodiment depicted in FIGS. 1 and 2, anchor points 116 and 118 are located on a line that is coincident with a linear propagation axis of laser beam 190. In another embodiment, one or both of anchor points 116 and 118 are offset from this axis. Additionally, without departing from the scope hereof, subassembly 120 may be configured such that the propagation path of laser beam 190, between the optical elements mounted to portion 132 is folded, as opposed to linear as shown in FIGS. 1 and 2.

In the embodiment depicted in FIGS. 1 and 2, each of portions 132 and 134 is fixed to baseplate 110 only at a single anchor point. Without departing from the scope hereof, since optical elements 140 and 142 are mounted to portion 132, portion 134 may be fixed to baseplate 110 at two or more anchor points (and thus potentially be affected by thermal expansion of baseplate 110). For example, portion 134 may be fixed to baseplate 110 at two anchor points 118 symmetrically offset from a linear propagation axis of laser beam.

As baseplate 110 expands, the distance between portion 132 and source area 112 changes. As a result, the points where optical elements 140 and 142 intersect laser beam 190 shift along the propagation axis of laser beam 190 when baseplate 110 expands. In one scenario, laser beam 190 is collimated (or at least approximately collimated) at the input to subassembly 120 such that the properties of laser beam 192 are insensitive (or at least approximately insensitive) to such changes in the distance between portion 132 and source area 112.

Optical element 140 defines an origin 198, from which subassembly 120 launches manipulated laser beam 192 for direct use or for further processing outside subassembly 120. To stabilize the position of origin 198 relative to baseplate 110, optical element 140 may be positioned close to anchor point 116 such that thermal expansion of portion 132 has minimal impact on the position of optical element 140, and origin 198, relative to anchor point 116. In one embodiment, optical element 140 is positioned such that origin 198 is directly above anchor point 116. Optical element 140 may be a mirror arranged to direct manipulated laser beam 192 out of subassembly 120 at a non-zero angle (e.g., approximately 90 degrees, as shown in FIGS. 1 and 2) to the propagation axis of laser beam 190 between source area 112 and subassembly 120. In this embodiment, positioning of optical element 140 close to anchor point 116 minimizes transverse translation of manipulated laser beam 192 caused by thermal expansion of portion 132. In particular, positioning the point of incidence and reflection of laser beam 190 on optical element 140 directly above anchor point 116 is expected to eliminate such transverse translation. Furthermore, in this embodiment, baseplate 110 may have through-holes (for mounting assembly 100 to a support) that are approximately aligned with the propagation axis of manipulated laser beam 192 for added temperature robustness. For example, anchor point 116 and two through-holes 111 of baseplate 110 may be located on a line that is either coincident with, or parallel and close to, the propagation axis of manipulated laser beam.

Optics plate 130 may be integrally formed. In one such implementation, flexible coupling 136 is in the form of one or more relatively thin and bendable connectors between portions 132 and 134. In another such implementation, flexible coupling 136 is in the form of one or more connectors between portions 132 and 134, wherein the contact area between each connector and each of portions 132 and 134 has a small cross-sectional area to allow flexure in the region proximate to the contact areas.

In one use scenario, a flow cytometer incorporates assembly 100 to generate and shape manipulated laser beam 192 for interrogation of samples. In this scenario, the flow cytometer further includes a focusing lens that focuses manipulated laser beam 192 at the sample flow path. This focusing lens may be mounted on baseplate 110, or externally to assembly 100.

FIG. 3 is a top plan view of one optomechanical assembly 300 for temperature-robust laser beam combination. Assembly 300 is an extension of assembly 100 wherein the baseplate supports a plurality of subassemblies 120 configured to manipulate different respective laser beams 190 and serially combine the manipulated laser beams. Assembly 300 may, advantageously, be implemented in a spectral flow cytometer to combine multiple laser beams of different colors and deliver the resulting composite laser beam to a sample flow path in a temperature robust manner.

Assembly 300 includes a baseplate 310. Baseplate 310 is an extension of baseplate 110 that includes a plurality of source areas 112 and a corresponding plurality of light-processing areas 114. Each source area 112 is configured to accommodate a respective laser source 160. Assembly 300 may be provided with or without laser sources 160. Assembly 300 includes a plurality of subassemblies 120, each mounted in a different respective light-processing area 114 to manipulate laser beam 190 received from laser source 160 of the corresponding source area 112. Each subassembly 120 of assembly 300 is configured within the corresponding light-processing area 114 of baseplate 310 in the same manner as subassembly 120 of assembly 100 is configured within light-processing area 114 of baseplate 110.

In the example depicted in FIG. 3, assembly 300 includes three source areas 112(1-3) and three light-processing areas 114(1-3). Each light-processing area 114(i), i∈{1, 2, 3}, contains a subassembly 120(i) configured to manipulate a laser beam 190(i) received from laser source 160(i) located in source area 112(i). Last optical element 140 of subassembly 120(1) is implemented as a mirror 340M that directs manipulated laser beam 192(1), produced by optical elements 142 of subassembly 120(1), toward last optical element 140 of subassembly 120(2). Last optical element 140 of subassembly 120(2) is implemented as a beam combiner 340C that combines manipulated laser beam 192(1) with manipulated laser beam 192(2), produced by optical elements 142 of subassembly 120(2), to form a composite laser beam 394(2). Beam combiner 340C of subassembly 120(2) directs composite laser beam 394(2) toward last optical element 140 of subassembly 120(3). Last optical element 140 of subassembly 120(3) is implemented as a beam combiner 340C that combines composite laser beam 394(2) with manipulated laser beam 192(3), produced by optical elements 142 of subassembly 120(3), to form a composite laser beam 394(3). Mirror 340M and each beam combiner 340C of assembly 300 thus cooperate to serially combine manipulated laser beams 192(1), 192(2), and 192(3) into a single composite laser beam 394(3).

In another embodiment, not shown in FIG. 3, assembly 300 omits the middle subassembly 120(2) and includes only the first subassembly 120(1) and the last subassembly 120(3) for combination of two laser beams. Similarly, the sequence of subassemblies 120 in assembly 300 may include more than one subassembly 120 between the first and last subassemblies 120 for serial combination of more than three laser beams. In such embodiments, the beam combiner 340 of each non-first subassembly 120 combines the manipulated laser beam 192, produced by this subassembly 120, with a manipulated or composite laser beam received from the preceding subassembly 120 in the sequence. Furthermore, one or more subassemblies 120 of assembly 300 may omit optical elements 142 and only function as a beam combiner, or, in the case of the first subassembly 120(1), serve to direct laser beam 190(1) to a second subassembly 120 in the sequence for combination with another laser beam.

In one scenario, each laser beam 190 processed by assembly 300 is a collimated laser beam at the input to the corresponding subassembly 120, and manipulation performed by subassemblies 120(1-3) may serve, at least in part, to change the size of these collimated laser beams. For example, the manipulation performed by subassemblies 120(1-3) may set the beam diameter of all the collimated laser beams to the same value. In this scenario, each subassembly 120 may include a telescope. In certain embodiments, assembly 300 matches the size of one or more collimated laser beams 190 to the size of one or more other collimated laser beams 190. For example, in implementations with three subassemblies 120 that process three respective collimated laser beams 190, subassembly 120(1) may omit optical elements 142, while optical elements 142 of subassemblies 120(2) and 120(3) generate manipulated laser beams 192 that have the same size as laser beam 190(1).

Although it is possible to configure assembly 300 to operate with at least some of laser beams 190 being non-parallel, the parallel configuration depicted in FIG. 3 likely is a more compact and simpler design to build and operate. In the embodiment depicted in FIG. 3, source areas 112 are distributed along a widthwise dimension parallel to the y-axis of coordinate system 302, and each light-processing area 114 is offset from the corresponding source area 112 in a lengthwise dimension parallel to the x-axis of coordinate system 302. In this embodiment, the propagation paths of the manipulated and composite laser beams, between subassemblies 120 and out of the last subassembly 120, may conveniently be substantially along the widthwise dimension. Furthermore, the propagation paths of laser beams 190 between source areas 112 and the corresponding light-processing areas 114 may be substantially along the lengthwise dimension, such that the beam combiner 140 of each non-first subassembly 120 combines two laser beams incident on the beam combiner from mutually orthogonal directions. For added temperature robustness, two screw holes of baseplate 110 may be collinear with anchor points 116.

Figure 4:
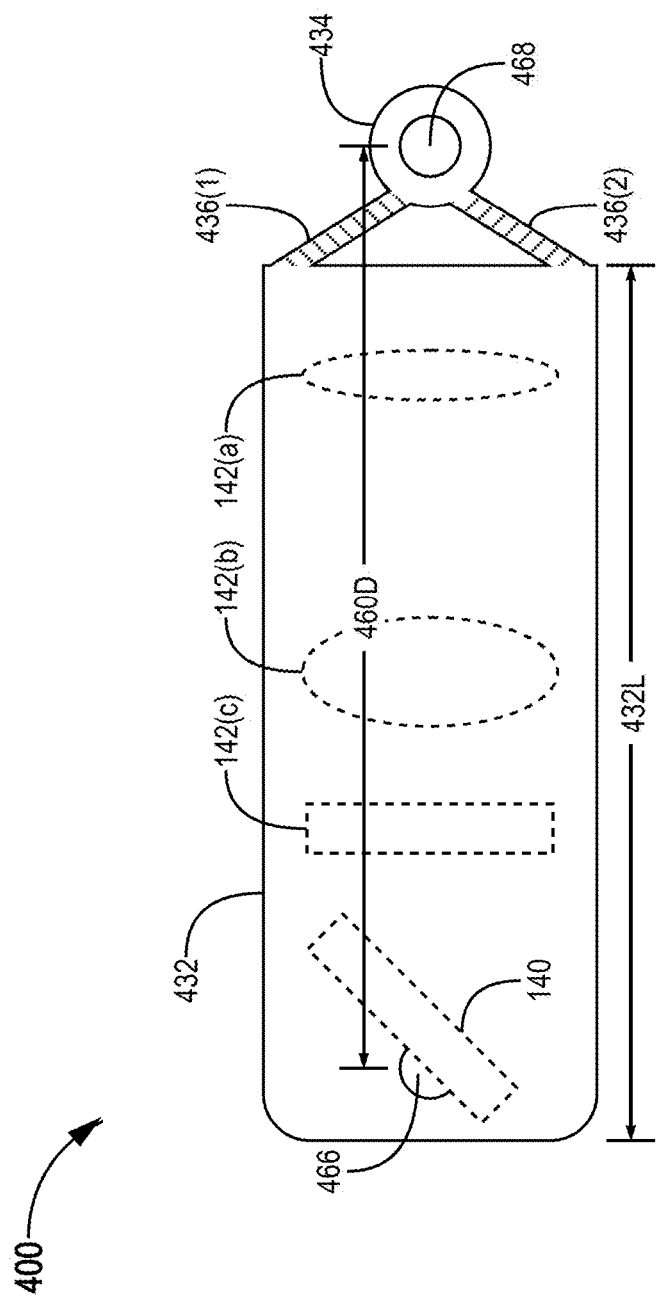
FIG. 4 illustrates an optics plate configured to accommodate a series of optical elements and decouple these optical elements from thermal expansion of a baseplate supporting the optics plate, according to an embodiment.

FIG. 4 is a top plan view of one optics plate 400 configured to accommodate a series of optical elements and decouple these optical elements from thermal expansion of a baseplate supporting the optics plate. Optics plate 400 is an embodiment of optics plate 130 and may be implemented in assemblies 100 and 300 on baseplates 110 and 310, respectively. Optics plate 400 includes portions 432 and 434 and two flexures 436. Each flexure 436 connects between portions 432 and 434. Portion 432 is configured to accommodate optical elements 140 and 142. Portion 432 defines a through-hole 466 configured to accommodate a fastener for fixing portion 432 to the baseplate, and portion 434 defines a through-hole 468 configured to accommodate a fastener for fixing portion 434 to the baseplate. In operation, as the baseplate expands, the distance 460D between through-holes 466 and 468 changes. Flexures 436 absorb this change, such that the length 432L of portion 432 remains unaffected by the thermal expansion of the baseplate.

Optics plate 400 may be integrally formed, for example machined from one solid piece of metal such as titanium or a titanium alloy. One or more of portion 432, portion 434, and flexures 436 may have a different shape than depicted in FIG. 4, without departing from the scope hereof.

In one use scenario, a flow cytometer incorporates assembly 300 to generate a composite laser beam 394 for interrogation of samples. In this scenario, the flow cytometer further includes a focusing lens that focuses composite laser beam 394(3) after being launched from beam combiner 340C of the laser subassembly 120(3). This focusing lens may be mounted on baseplate 310, or externally to assembly 300. In one preferred embodiment, the optical axis of the focusing lens is aligned with the propagation axis of the composite laser beam 294(3).

FIGS. 5 and 6 are top plan views of another optics plate 500 including two flexures that serve to decouple a series of optical elements from thermal expansion of a supporting baseplate. FIGS. 5 and 6 show optics plate 500 at two different temperatures, with configuration changes being exaggerated for clarity. The temperature associated with FIG. 6 is higher than the temperature associated with FIG. 5. Optics plate 500 is an embodiment of optics plate 400 that defines a slit 570. Slit 570 defines (a) a portion 532 defining a through-hole 466 and configured to accommodate optical elements 140 and 142 and, (b) a portion 534 defining a through-hole 468, and (c) two flexures 536(1) and 536(2), each connecting between portions 532 and 534.

More specifically, slit 570 partially surrounds through-hole 468, with a rim-shaped segment of portion 534 between slit 570 and through-hole 468. Slit 570 extends in two opposite directions away from through-hole 468 to two respective termini 572(1) and 572(2). Slit 570 thereby separates portions 532 and 534 from each other. Each flexure 536 extends from portion 534 to portion 532 at a respective one of the two termini 572. Slit 570 may be formed by wire erosion.

In operation, as the baseplate expands, the distance 460 between through-holes 466 and 468 changes from distance 460L in FIG. 5 to distance 460L' in FIG. 6. Flexures 536 absorb this change, as seen in FIG. 6, such that the length 532L of portion 532 remains unaffected by the thermal expansion of the baseplate (although length 532L may increase from length 532L in FIG. 5 to a length 532L' in FIG. 6 due to thermal expansion of optics plate 500 itself). Each flexure 536 may flex primarily at the corresponding terminus 572 and/or at its connection to portion 536 near the rim around through-hole 468. Alternatively, a substantial portion of the flex may be distributed along the length of each flexure 536 between portions 532 and 534.

In one implementation, width 532W of optics plate 500 is in the range between 5 and 100 millimeters, and the dynamic range of flexures 536 can accommodate a change in distance 460L of at least several microns, for example at least 5 microns.

Figure 7:
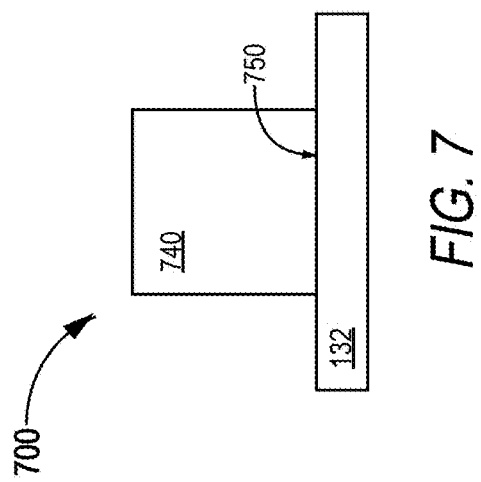
FIG. 7 illustrates direct bonding of an optical element to an optics plate, according to an embodiment.

FIG. 7 illustrates, in side-view, a configuration 700 wherein an optical element 740 is bonded directly to a top surface 750 of portion 132 of optics plate 130. Any one of optical elements 140 and 142 may be bonded directly to portion 132 according to configuration 700.

Figure 8:
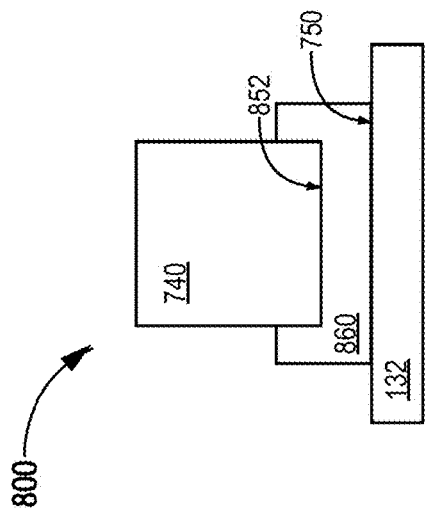
FIG. 8 illustrates indirect bonding of an optical element to an optics plate via a mount, according to an embodiment.

FIG. 8 illustrates, in side-view, a configuration 800 wherein optical element 740 is only indirectly bonded to top surface 750 of portion 132 of optics plate 130 via a mount 860. In configuration 800, optical element 740 is directly bonded to a surface 852 of mount 860, and mount 860 is directly bonded to top surface 750 of portion 132. Mount 860 may be made of the same material as optical element 740, or a similar material. For example, optical element 740 and mount 860 may both be made of a low-CTE glass, such as borosilicate glass. Alternatively, mount 860 may be made of the same material or a similar material to portion 132. Mount 860 may even be an integral feature of portion 132. Any one of optical elements 140 and 142 may be bonded to portion 132 according to configuration 800.

Figure 9:
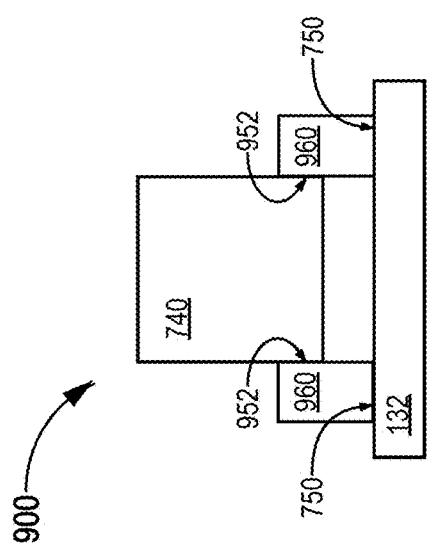
FIG. 9 illustrates indirect bonding of an optical element to an optics plate via two pillars that hold the optical element above the optics plate, according to an embodiment.

FIG. 9 illustrates, in side-view, a configuration 900 wherein optical element 740 is only indirectly bonded to top surface 750 of portion 132 of optics plate 130 via two pillars 960 that hold optical element 740 above top surface 750. In configuration 900, optical element 740 is clamped between pillars 960, with optical element 740 being directly bonded to a side surface 952 of each pillar 960. Each pillar 960 is directly bonded to top surface 750. Any one of optical elements 140 and 142 may be bonded to portion 132 according to configuration 900.

Each direct bond in configurations 700, 800, and 900 may include an adhesive or be adhesive-free (e.g., formed by contact bonding). Optical elements 140 and 142 may be indirectly bonded to top surface 750 of portion 132 according to different and more elaborate bonding configurations than those shown in FIGS. 7-9, as long as the bonds are rigid.

The present invention is described above in terms of a preferred embodiment and other embodiments. The invention is not limited, however, to the embodiments described and depicted herein. Rather, the invention is limited only by the claims appended hereto.

What is claimed is:

1. An optomechanical assembly for temperature-robust laser beam processing, comprising:
   a baseplate including:
      a source area for accommodating a source of the laser beam, and
      a light-processing area located away from the source area and including first and second anchor points;
   an optics plate disposed in the light-processing area and including first and second portions and a flexible coupling interconnecting the first and second portions, the first and second portions being fixed to the baseplate at the first and second anchor points, respectively, with the flexible coupling allowing for a thermally induced change in distance between the first and second anchor points in the presence of dissimilar thermal expansion of the optics plate and the baseplate; and a linearly arranged series of optical elements for manipulating a laser beam from the laser source, each of the optical elements being rigidly bonded to the first portion of the optics plate and arranged along a propagation axis of the laser beam that is coincident with a line between the first and second anchor points;

wherein the coefficient of thermal expansion (CTE) of the optics plate is (a) matched to the CTEs of the optical elements to within 20% and (b) lower than the CTE of the baseplate.

2. The assembly of claim 1, wherein each of at least one of the optical elements is rigidly bonded to the optics plate via one or more rigid mounts having a CTE matched to the CTE of the corresponding optical element to within 20%.

3. The assembly of claim 1, wherein each of the baseplate and the optics plate is made of metal, and the optical elements are made of glass.

4. The assembly of claim 3, wherein each optical element is rigidly bonded to the optics plate either directly or via two glass pillars.

5. The assembly of claim 4, wherein the one or more glass pillars and the optical elements are made of the same material.

6. The assembly of claim 3, wherein the optics plate and the optical elements have CTEs less than $10^{-5}$ $K^{-1}$.

7. The assembly of claim 3, wherein the optics plate is made of titanium or a titanium alloy, and the optical elements are made of borosilicate glass.

8. The assembly of claim 1, wherein the flexible coupling includes a pair of flexures, each interconnecting the first and second portions.

9. The assembly of claim 1, wherein the optics plate defines:
a first through-hole at the first anchor point;
a second through-hole at the second anchor point; and
a slit that (a) partially surrounds the second through-hole with a segment of the second portion between the slit and the second through-hole and (b) extends in two opposite directions away from the second through-hole to two respective termini, such that the slit separates the first and second portions from each other and defines two flexures forming the flexible coupling, each flexure extending from the second portion to the first portion at a respective one of the two termini, respectively.

10. The assembly of claim 1, wherein the optical elements include a telescope.

11. A temperature-robust optomechanical assembly for laser beam combination, comprising:
the assembly of claim 1, wherein the baseplate forms several instances of the source area and the assembly includes several corresponding instances of both the optics plate and the series of optical elements bonded thereto, the several instances of the series of optical elements being configured to manipulate several corresponding instances of the laser beam received from the respective source areas; and
a mirror rigidly bonded to a first instance of the optics plate, and, for the one or more subsequent instances of the optics plate, one or more respective beam combiners rigidly bonded thereto to serially combine the laser beams as manipulated.

12. A temperature-robust optomechanical assembly for laser beam combination, comprising:
a baseplate having orthogonal lengthwise and widthwise dimensions, and including a sequence of source areas distributed along the widthwise dimension and each configured to accommodate a laser source for generating a respective laser beam;
a corresponding sequence of optical subassemblies offset from the sequence of source areas in the lengthwise dimension, each optical subassembly including an optics plate fixed to the baseplate, each optics plate including at least one flexure to accommodate dissimilar thermal expansion of the optics plate and the baseplate, at least one of the optical subassemblies including a linearly arranged series of optical elements that is (a) rigidly bonded to the optics plate, (b) characterized by coefficients of thermal expansion (CTEs) that are matched with the CTE of the optics plate to within 20%, and (c) configured to manipulate the laser beam received from the corresponding source area; and
a mirror rigidly bonded to the optics plate of a first one of the optical subassemblies, and, for each of the one or more subsequent optical subassemblies, a respective beam combiner rigidly bonded to the optics plate thereof, the mirror and the one or more beam combiners being cooperatively configured to serially combine the laser beams.

13. The assembly of claim 12, wherein the mirror and the one or more beam combiners are aligned to a substantially widthwise propagation path of the laser beams.

14. The assembly of claim 13, wherein each laser beam has a lengthwise propagation path from the respective source area to the series of optical elements of the corresponding optical subassembly.

15. The assembly of claim 12, wherein the baseplate includes at least two source areas, and the sequence of optical subassemblies includes at least two optical subassemblies having a corresponding linearly arranged series of optical elements for manipulation of the respective laser beam.

16. The assembly of claim 12, wherein, for each optical subassembly, (a) the optics plate includes first and second portions connected to each other via the at least one flexure, each of the first and second portions being fixed to the baseplate at a respective single anchoring point, and (b) the optical elements are rigidly bonded to the first portion.

17. The assembly of claim 16, wherein the mirror and the one or more beam combiners are bonded to the respective optics plate at the anchoring point of the first portion, to minimize thermal-expansion-induced displacement of the mirror and the one or more beam combiners in the lengthwise dimension.

18. The assembly of claim 12, wherein the optics plate has a lower CTE than the baseplate.

19. The assembly of claim 12, wherein each series of optical elements includes a plurality of lenses for changing at least one of size and divergence of the laser beam.

20. The assembly of claim 19, wherein each of the lenses is rigidly bonded to the optics plate, either directly or via one or more rigid mounts, each rigid mount having a CTE matched to the CTEs of the optical elements to within 20%.

21. The assembly of claim 12, further comprising the laser source associated with each source area, wherein each laser source is configured to deliver the respective laser beam to the corresponding optical subassembly as a collimated input laser beam, and wherein at least one series of optical elements includes a telescope for changing diameter of the laser beam while maintaining collimation.

22. A flow-cytometer, comprising:
the assembly of claim 12, further including the laser source associated with each source area, for generating a composite laser beam consisting of the laser beams as serially combined; and
a focusing element for focusing the composite laser beam to a sample flow path.

\* \* \* \* \*